US 9,418,756 B2

(12) United States Patent
Liang et al.

(10) Patent No.: US 9,418,756 B2
(45) Date of Patent: Aug. 16, 2016

(54) THRESHOLD VOLTAGE COMPENSATION CIRCUIT OF THIN FILM TRANSISTOR AND METHOD FOR THE SAME, SHIFT REGISTER, AND DISPLAY DEVICE

(71) Applicant: BOE TECHNOLOGY GROUP CO., LTD., Beijing (CN)

(72) Inventors: Yinan Liang, Beijing (CN); Lifei Ma, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 283 days.

(21) Appl. No.: 14/235,670

(22) PCT Filed: Jun. 24, 2013

(86) PCT No.: PCT/CN2013/077779
§ 371 (c)(1),
(2) Date: Jan. 28, 2014

(87) PCT Pub. No.: WO2014/161233
PCT Pub. Date: Oct. 9, 2014

(65) Prior Publication Data
US 2015/0255170 A1    Sep. 10, 2015

(30) Foreign Application Priority Data

Apr. 3, 2013  (CN) .......................... 2013 1 0116442

(51) Int. Cl.
*H03L 5/00* (2006.01)
*G11C 19/28* (2006.01)
*G09G 3/32* (2016.01)

(52) U.S. Cl.
CPC .............. *G11C 19/28* (2013.01); *G09G 3/3241* (2013.01); *G09G 2300/043* (2013.01); *G09G 2310/0286* (2013.01)

(58) Field of Classification Search
CPC .................................... H03L 5/00; H03L 5/02
See application file for complete search history.

(56) References Cited

U.S. PATENT DOCUMENTS

| 7,253,700 | B1 * | 8/2007 | Chiu ................... H03G 1/0088 327/308 |
| 7,340,229 | B2 | 3/2008 | Nakayama et al. |
| 7,477,085 | B2 * | 1/2009 | Stevenson ........... H03G 1/0088 327/308 |

FOREIGN PATENT DOCUMENTS

CN    1738195 A    2/2006

OTHER PUBLICATIONS

International Preliminary Report on Patentability Appln. No. PCT/CN2013/077779; Dated Oct. 6, 2015.

*Primary Examiner* — Hai L Nguyen
(74) *Attorney, Agent, or Firm* — Ladas & Parry LLP

(57) ABSTRACT

Provided are a threshold voltage compensation circuit of TFT and a method for the same, a shift register and a display device. The threshold voltage compensation circuit includes an input terminal, an output terminal connected to the source of the thin film transistor, a first resistor to a $K^{th}$ resistor connected in series, and $K^{th}$ connectable link and at least one first connectable link. Since a voltage dividing circuit having connectable links divides the voltage input to the source of the thin film transistor, such that the gate-source voltage of the thin film transistor can be changed by changing the voltage of the source of the thin film transistor when the voltage of the gate of the thin film transistor is maintained unchanged, so as to control a leakage current of the thin film transistor under a turn-off state, such that the thin film transistor can be turned off normally.

20 Claims, 3 Drawing Sheets

THRESHOLD VOLTAGE COMPENSATION CIRCUIT OF THIN FILM TRANSISTOR AND METHOD FOR THE SAME, SHIFT REGISTER, AND DISPLAY DEVICE

CROSS REFERENCE TO RELATED APPLICATIONS

This application is based on International Application No. PCT/CN2013/077779 filed on a Jun. 24, 2013, which claims priority to Chinese National Application No. 201310116442.8 filed on Apr. 3, 2013, the contents of which are incorporated herein by reference.

TECHNICAL FIELD OF THE DISCLOSURE

The present disclosure relates to a field of display technology, and particularly to a threshold voltage compensation circuit of a Thin Film Transistor(TFT) and method for the same, a shift register and a display device.

BACKGROUND

Based on the gate-driver on array (GOA) technology, circuitry functions of a shift register are implemented by using TFTs, and the shift register is integrated on a pixel array substrate. GOA can be manufactured under a same production process with the pixel array substrate, and thus the production flow of the display device is simplified.

Although the GOA technology has the above advantages, the GOA technology currently still has the following problems: the shift register integrated on the array substrate is highly dependent on the TFT characteristics, and especially the current threshold voltage of TFT has a great influence on the stability of the shift register, since the ununiformity or the drift of the current threshold voltage of TFTs constituting the shift register will cause malfunction or failure of the shift register.

However, at present, the manufacturing process for the low-temperature poly-silicon Thin Film Transistor is still in an immature stage, the current threshold voltage of the manufactured LTPS-TFT cannot be ensured consistency effectively and thus there is inconsistence among the current threshold voltages of respective LTPS-TFTs. Meanwhile, crystallization of amorphous silicon film is required for the LTPS technology, which may cause difference among the current threshold voltages of LTPS-TFTs in the glass substrate, particularly in the curve of the source-drain current and the gate-source voltage ($I_{ds}$-$V_{gs}$) characteristics, the ($I_{ds}$-$V_{gs}$) will drift as the current threshold voltage drifts. As for an amorphous silicon TFT, after a long-term operation, its current threshold voltage will drift under the influence of a positive stress, and particularly in the curve of the source-drain current and the gate-source voltage ($I_{ds}$-$V_{gs}$) characteristics, the ($I_{ds}$-$V_{gs}$) will drift as the current threshold voltage drifts.

Below, reasons for the failure of a shift register will be explained by taking the $I_{ds}$-$V_{gs}$ transfer characteristics curves of an N-type TFT manufactured by the LIPS technology in a normal state and in an abnormal state as shown in FIGS. 1 and 2, respectively as an example. The curve represented by a reference numeral "a" is obtained when the source-drain voltage is 10.1 V, and reflects the transfer characteristics when the TFT is in a saturation state. The curve represented by a reference numeral "b" is obtained when the source-drain voltage is 0.1 V, and reflects the transfer characteristics when the TFT is in a non-saturation state. It can be seen from FIG. 1 that, in the non-saturation state, when the gate-source voltage is 0V, the off-state current (that is, the source-drain current) is smaller than $10^{-11}$ A, but the off-state current is greater than $10^{-9}$ A when the gate-source voltage is 0V in FIG. 2. In FIG. 2, the TFT operates in a sub-threshold operation region wherein there is an exponential relationship between the source-drain current and the gate-source voltage, the off-state current will varies significantly when the gate voltage has a certain disturbance. The shift register constituted by the TFTs with the characteristics curve in FIG. 2 has the following two problems: first, a large off-state current will cause increase in the power consumption of the shift register; secondly, a too large off-state current will result in that it is difficult to maintain the charges on the storage capacitor in the shift register, and thus the thin film transistor associated cannot be turned off normally and in turn the shift register cannot operate normally.

In summary, the phenomenon that the current threshold voltage of a thin film transistor drifts may seriously affect the normal turn-off of the thin film transistor, and in turn affects the normal operation of the circuit configuration including the thin film transistor; in the shift register, if the current threshold voltage of the thin-film transistor which controls the signal output is inconsistent or drifts, the normal output of the entire shift register is affected directly.

SUMMARY

In embodiments of the present disclosure, there are provided a threshold voltage compensation circuit of a TFT and a method for the same, a shift register and a display device, for solving the problem that in the existing shift register the ununiformity or the drift of the current threshold voltage the TFT at the output terminal of the shift register cause the failure of the shift register.

The particular technical solutions provided in the embodiments of the present disclosure are as follows.

According to one aspect of the present disclosure, there is provided a threshold voltage compensation circuit of a thin film transistor, including a compensation module connected to a source of the thin film transistor, wherein the compensation module controls a voltage difference between the gate and source of the thin film transistor to be equal to a current threshold voltage of the thin film transistor when the current threshold voltage is inconsistent with a predetermined standard threshold voltage.

In an embodiment, the compensation module includes an input terminal, an output terminal connected to the source of the thin film transistor, a first resistor to a $K^{th}$ resistor connected in series, a $K^{th}$ connectable link and at least one first connectable link, wherein K is a positive integer greater than 1;

wherein the $K^{th}$ connectable link corresponds to the $K^{th}$ resistor and is disposed between the input terminal and the output terminal, and is used for switching on a connection between the input terminal and the output terminal when the current threshold voltage of the thin film transistor is consistent with the predetermined standard threshold voltage, and switching off the connection between the input terminal and the output terminal when the current threshold voltage of the thin film transistor is inconsistent with the predetermined standard threshold voltage;

the first connectable link is disposed between a node where a $k^{th}$ resistor and a $(k+1)^{th}$ resistor are connected in series and the output terminal, and is used for switching off or switching on a connection between the output terminal and the $k^{th}$ resistor when the current threshold voltage of the thin film transistor is inconsistent with the predetermined standard threshold voltage, wherein k is a positive integer greater than or equal to 1 and less than or equal to K−1;

one terminal of the first resistor is connected to one terminal of the second resistor and the other terminal of the first resistor is grounded;

one terminal of the $K^{th}$ resistor is connected to the input terminal and the other terminal of the $K^{th}$ resistor is connected to one terminal of the $(K-1)^{th}$ resistor;

the first resistor to the $K^{th}$ resistor are used for dividing a supply voltage input to the input terminal collaboratively under controls of the $K^{th}$ connectable link and at least one first connectable link, so as to control the voltage difference between the gate and source of the thin film transistor to be equal to the current threshold voltage.

According to another aspect of the present disclosure, there is provided a shift register including a thin film transistor at an output terminal of the shift register for controlling an output signal at the output terminal of the shift register; wherein the source of the thin film transistor at the output terminal is connected to the above-described threshold voltage compensation circuit of the thin film transistor, and the voltage difference between the gate and source of the thin film transistor at the output terminal is equal to the current threshold voltage of the thin film transistor under the control of the compensation circuit.

According to another aspect of the present disclosure, there is provided a display device including the above-described shift register.

According to another aspect of the present disclosure, there is provided a method for compensating for the threshold voltage of the thin film transistor by the above-described compensation circuit, including:

controlling a voltage difference between the gate and source of the thin film transistor to be equal to a current threshold voltage of the thin film transistor when the current threshold voltage of the thin film transistor is inconsistent with the predetermined standard threshold voltage.

In the embodiments of the present disclosure, the voltage dividing circuit having connectable links divides the voltage input to the source of the thin film transistor, such that the gate-source voltage of the thin film transistor can be changed by changing the voltage of the source of the thin film transistor in a case in which the voltage of the gate of the thin film transistor is maintained unchanged, so that the gate-source voltage of the thin film transistor is equal to the current threshold voltage of the thin film transistor. On this basis, the thin film transistor can be turned off under the control of the normal voltage supplied by the circuit where the thin film transistor is located, that is, the thin film transistor can be turned off normally even if the threshold voltage thereof drifts. Therefore, when the above compensation circuit is applied to the shift register, the problem that the current threshold voltage inconsistent with the standard threshold voltage or the drift in the current threshold voltage causes the malfunction or failure of the shift register can be overcome.

DETAILED DESCRIPTION

Below, specific implementations of a circuit and method for compensating for a threshold voltage of a TFT, a shift register and a display device provided in embodiments of the present disclosure will be described with reference to the accompanying drawings.

First Embodiment

Figure 3:
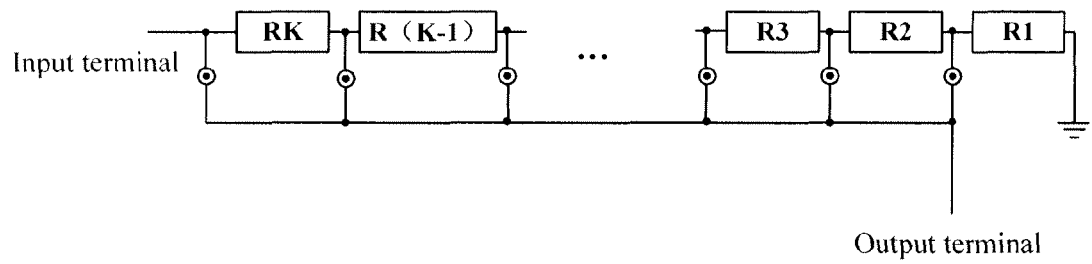
FIG. 3 is a schematic diagram of a threshold voltage compensation circuit of a thin film transistor in a first embodiment of the present disclosure.

According to the first embodiment, there is provided a threshold voltage compensation circuit of a thin film transistor, including a compensation module connected to a source of the thin film transistor, wherein the compensation module controls the voltage difference between the gate and source of the thin film transistor to be equal to a current threshold voltage of the thin film transistor when the current threshold voltage is inconsistent with a predetermined standard threshold voltage. Particularly, as shown in FIG. 3, the compensation module includes an input terminal, an output terminal connected to the source of the thin film transistor, a first resistor R1 to a $K^{th}$ resistor RK connected in series, a $K^{th}$ connectable link and at least one first connectable link, wherein K is a positive integer greater than 1, and the $K^{th}$ connectable link and the first connectable link are represented by a sign "⊙" in FIG. 3.

The $K^{th}$ connectable link corresponds to the $K^{th}$ resistor and is disposed between the input terminal and the output terminal, and is used for switching on a connection between the input terminal and the output terminal when the current threshold voltage of the thin film transistor is consistent with the predetermined standard threshold voltage and switching off the connection between the input terminal and the output terminal when the current threshold voltage of the thin film transistor is inconsistent with the predetermined standard threshold voltage.)

The first connectable link is disposed between a node where a $k^{th}$ resistor and a $(k+1)^{th}$ resistor are connected in series and the output terminal, and is used for switching on or switching off a connection between the output terminal and the $k^{th}$ resistor when the current threshold voltage of the thin film transistor is inconsistent with the predetermined standard threshold voltage, wherein k is a positive integer greater than or equal to 1 and less than or equal to K−1.

One terminal of the first resistor R1 is connected to one terminal of the second resistor R2 and the other terminal of the first resistor R1 is grounded.

One terminal of the $K^{th}$ resistor RK is connected to the input terminal and the other terminal of the $K^{th}$ resistor is connected to one terminal of the $(K-1)^{th}$ resistor R(K−1).

The first resistor R1 to the $K^{th}$ resistor RK are used for dividing a supply voltage input to the input terminal collaboratively under controls of the $K^{th}$ connectable link and at least one first connectable link, so as to control the voltage difference between the gate and source of the thin film transistor to be equal to the current threshold voltage.

The above first resistor R1 to the $K^{th}$ resistor RK adjust the voltage input to the source of the thin film transistor, so that the voltage difference between the gate and source of the thin film transistor is equal to the current threshold voltage. Optionally, in order to adjust the voltage input to the source of the thin film transistor accurately, the number of the first connectable links is K−1, that is, the first connectable links are a connectable link 1 to a connectable link (K−1), which correspond to a first resistor to a (K−1)$^{th}$ resistor respectively, wherein the connectable link k is arranged between the node where the k$^{th}$ resistor and the (k+1)$^{th}$ resistor are connected in series and the output terminal, and each of the connectable links is represented by a sign "⊙" in FIG. 3, wherein from right to left, a connectable link behind a resistor is the connectable link corresponding to the resistor.

It should be noted that the switching-on or switching-off of the k$^{th}$ connectable link is determined according to value of the difference between the current threshold voltage and the predetermined standard threshold voltage, the value of the supply voltage input to the input terminal, and the resistance values of the respective resistors, wherein k is a positive integer greater than 0 and less than or equal to K−1.

Optionally, in order to facilitate changing the voltage actually input to the source of the thin film transistor, the first resistor to the K$^{th}$ resistor connected in series have a same resistance value.

For example, it is assumed that K=7, the supply voltage input to the input terminal is −7V (herein, the voltage at the ground point is 0V and is used as a reference voltage), and it is required to change the voltage output from the output terminal connected to the source of the thin film resistor to −5V. Since the respective resistors connected in series have the same resistance value, the voltage drops across the respective resistors are same; therefore the seventh connectable link and the connectable link 6 can be switched off and the connectable link 1 to the connectable link 5 can be switched on, and at this time the voltage of a supply voltage output from the output terminal is −5V. As another implementation, only the connectable link 5 is switched on, and the other connectable links can be switched off, and at this time the voltage of a supply voltage output from the output terminal is also −5V.

Actually, a constant voltage signal which can ensure that the thin film transistor is turned on can be applied to the gate and source of the above-described thin film transistor, and a voltage variation amount (that is, a variation amount of the current threshold voltage) is obtained by detecting the voltage value of the voltage signal output from the drain of the thin film transistor at different timings, wherein one timing is a current timing, another timing is a predetermined timing, and the threshold voltage of the thin film transistor detected at the predetermined timing is the predetermined standard threshold voltage.

In an actual implementation, if the TFT is manufactured on the array substrate, after the threshold voltage compensation circuit of the thin film transistor is manufactured, the connectable links as determined can be cut off in a laser cutting manner when the current threshold voltage of TFT is different from the predetermined standard threshold voltage.

Figure 4:
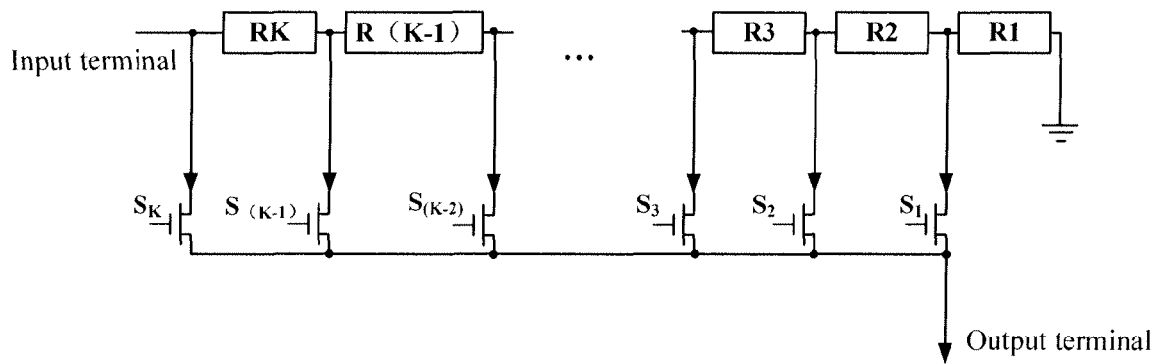
FIG. 4 is a schematic diagram of a threshold voltage compensation circuit of a thin film transistor in a first embodiment of the present disclosure.

In addition, in an actual implementation, a device for implementing the above connectable link can be a TFT; in this case, the threshold voltage compensation circuit of the thin film transistor shown in FIG. 3 becomes a threshold voltage compensation circuit of a thin film transistor shown in FIG. 4. In FIG. 4, the thin film transistor $S_1$ to the thin film transistor $S_k$ are controlled to be turned on or off by controlling the voltages input to the gates of the thin film transistor $S_1$ to the thin film transistor $S_k$, so that the voltage division by the resistors can be achieved and in turn the output terminal can output different voltages to ensure that the gate-source voltage of the thin film transistor having a source connected to the output terminal is equal to the current threshold voltage itself, and on such a basis, thereby the thin film transistor can be turned off normally when receiving a normal voltage supplied in the circuit where the thin film transistor is located.

Optionally, when the thin film transistor having a source connected to the output terminal is an N-type transistor, the supply voltage input to the input terminal is less than 0. Since the threshold voltage of the N-type thin film transistor drifts in a negative direction, the connectable link 1 to the connectable link m−1 can be switched off and the connectable link m can be switched on when the current threshold voltage of the thin film transistor is inconsistent with the predetermined standard threshold voltage, wherein m is determined by a following equation:

$$\Delta V = \frac{\sum_{j=m+1}^{K} R_j}{\sum_{i=1}^{K} R_i} \times V$$

Wherein ΔV represents a difference between the current threshold voltage and the predetermined threshold voltage, V represents a voltage input to the input terminal, $R_i$ represents a resistance value of the i$^{th}$ resistor, i represents a positive integer greater than or equal to 1 and less than or equal to K, and m represents a positive integer greater than or equal to 1 and less than or equal to K−1.

Optionally, when the thin film transistor having a source connected to the output terminal is a P-type transistor, the supply voltage input to the input terminal is greater than 0. Since the current threshold voltage of the P-type thin film transistor drifts in a positive direction, the connectable link m+1 to the connectable link K−1 can be switched off and the connectable link m can be switched on when the current threshold voltage of the thin film transistor is inconsistent with the predetermined standard threshold voltage, wherein m is determined by a following equation:

$$\Delta V = \frac{\sum_{j=m+1}^{K} R_j}{\sum_{i=1}^{K} R_i} \times V$$

Wherein ΔV represents a difference between the current threshold voltage and the predetermined threshold voltage, V represents a voltage input to the input terminal.

As for a P-type thin film transistor, after the connectable link m+1 to the connectable link K−1 are switched off and the connectable link m is switched on, the supply voltage input to the input terminal passes through the K$^{th}$ resistor RK to the (m+1)$^{th}$ resistor R(m+1) to make the voltage supplied to the source of the thin film transistor be V−ΔV, and thus the variation amount of the voltage difference between the gate voltage and the source voltage of the thin film transistor is ΔV when the voltage supplied to the gate of the thin film transistor is maintained unchanged, which is equivalent to compensation of the variation amount of the current threshold voltage (that is, the difference between the current threshold voltage and the predetermined threshold voltage).

In the technical solution of the first embodiment of the present disclosure, the voltage dividing circuit having connectable links divides the voltage input to the source of the thin film transistor, such that the gate-source voltage of the thin film transistor can be changed by changing the voltage of the source of the thin film transistor when the voltage of the gate of the thin film transistor is maintained unchanged, so that the gate-source voltage of the thin film transistor is equal to the current threshold voltage of the thin film transistor. On this basis, the thin film transistor can be turned off under a control of the normal voltage supplied by the circuit where the thin film transistor is located. Therefore, when the above compensation circuit is applied to the shift register, the problem that the current threshold voltage inconsistent with the standard threshold voltage or the drift in the current threshold voltage causes the failure of the shift register can be removed.

It should be explained that the thin film transistors adopted in the embodiments of the present disclosure can be oxide thin film transistors, amorphous silicon thin film transistors, low-temperature poly-silicon thin film transistors, and no limitation is made to the type of the thin film transistors adopted in the embodiments of the present disclosure herein.

Below, the application of the threshold voltage compensation circuit of the thin film transistor according to the first embodiment of the present disclosure to a shift register is described through the technical solution in a second embodiment of the present disclosure.

Second Embodiment

In the second embodiment of the present disclosure, there is provided a shift register including a thin film transistor at an output terminal for controlling an output signal from the output terminal of the shift register;

wherein the source of the thin film transistor at the output terminal is connected to the threshold voltage compensation circuit of the thin film transistor described in the first embodiment, and the voltage difference between the gate and source of the thin film transistor at the output terminal is equal to the current threshold voltage under the control of the compensation circuit.

Figure 5:
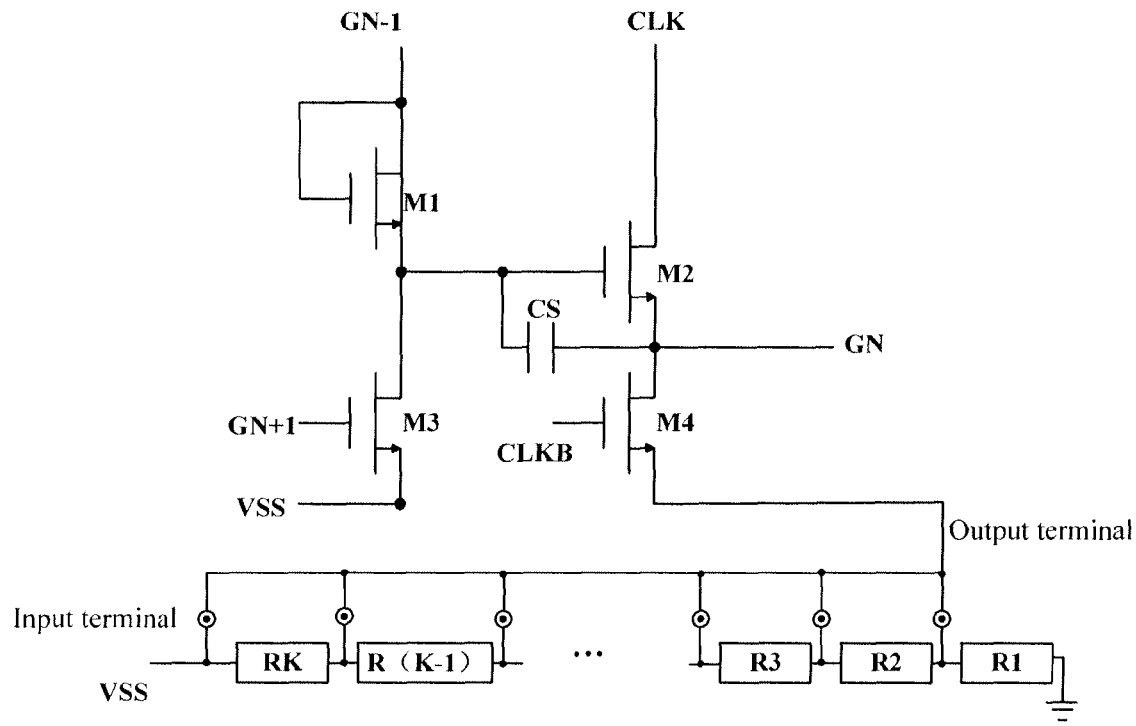
FIG. 5 is a circuit diagram of a shift register constituted by N-type TFTs in the second embodiment of the present disclosure.

The shift register constituted by N-type TFTs as shown in FIG. 5 is a shift register in the second embodiment of the present disclosure, wherein the thin film transistor at the output terminal of the shift register is M4, and the source of M4 is connected to the threshold voltage compensation circuit of the thin film transistor in the first embodiment. In a case in which M4 is an amorphous silicon thin film transistor, if the threshold voltage of M4 drifts during its operation, that is, the current threshold voltage is inconsistent with the predetermined standard threshold voltage, the connectable links in the compensation circuit connected to M4 is switched on or switched off to realize the gate-source voltage value equal to the current threshold voltage. At this time, M4 operates in an operating region rather than in the sub-threshold operating region as mentioned in the BACKGROUND, wherein the source-drain current does not vary with the variation of the gate-source voltage in an exponential relationship, so as to ensure a normal turn-on of M4 and ensure the normal operation of the shift register.

Figure 1:
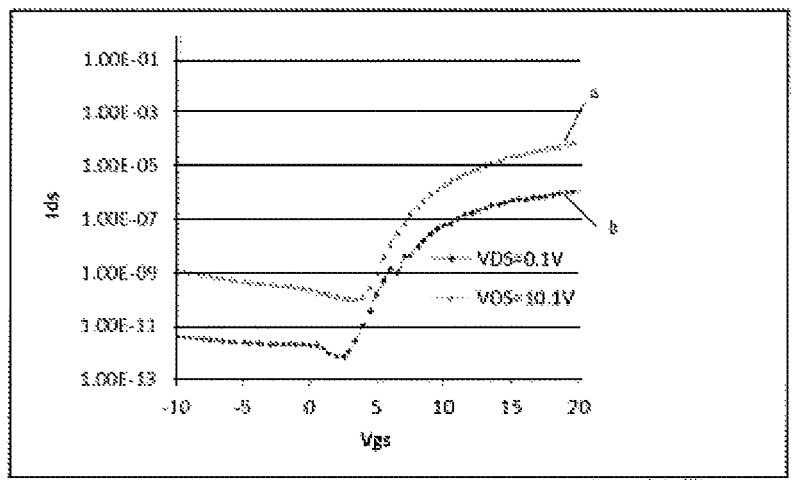
FIG. 1 is a $I_{ds}$-$V_{gs}$ transfer characteristics curve of a TFT under a normal state in the prior art.
Figure 2:
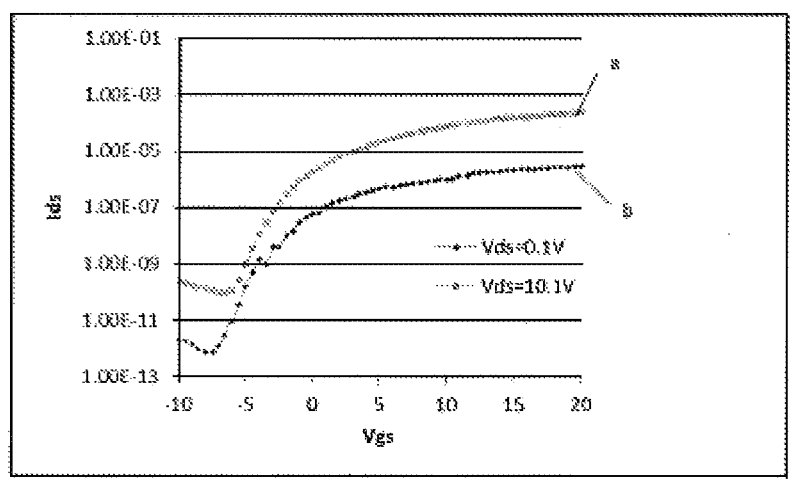
FIG. 2 is a $I_{ds}$-$V_{gs}$ transfer characteristics curve of a TFT under an abnormal state in the prior art

Taking the above M4 as an example, it is assumed that the amplitude of the signal VSS is −7V and the amplitude of the signal CLKB is 14V~−7V in a normal operational condition. When the M4 is in a turned-off state, the potentials of VSS and CLKB are both −7V, and $V_{GS-M4}$=0V at this time. When TFT operates in the state as shown in FIG. 2, the value of the drain-source current $I_{ds}$=$10^{-7}$ A, the current threshold voltage is −5V which is inconsistent with the predetermined standard threshold voltage 0V, and thus the off-state current is too large to ensure the normal operation of the circuit. At this time, the voltage signal input to the source of M4 is adjusted by the compensation circuit connected to M4 and for compensating for the threshold voltage of the thin film transistor, to enable the voltage signal to increase from −7V to −2V, and thus the variation amount of the voltage signal input to the source of the thin film transistor is 5V at this time. Meanwhile, the gate-source voltage of M4 becomes to $V_{GS}$=−7V−(−2V)=−5V, that is, the gate-source voltage of M4 is equal to its current threshold voltage −5V. As shown in FIG. 2, when $V_{GS}$ is −5V, its drain-source current is less than $10^{-9}$ A, which ensures the normal operation of the shift register.

Figure 6:
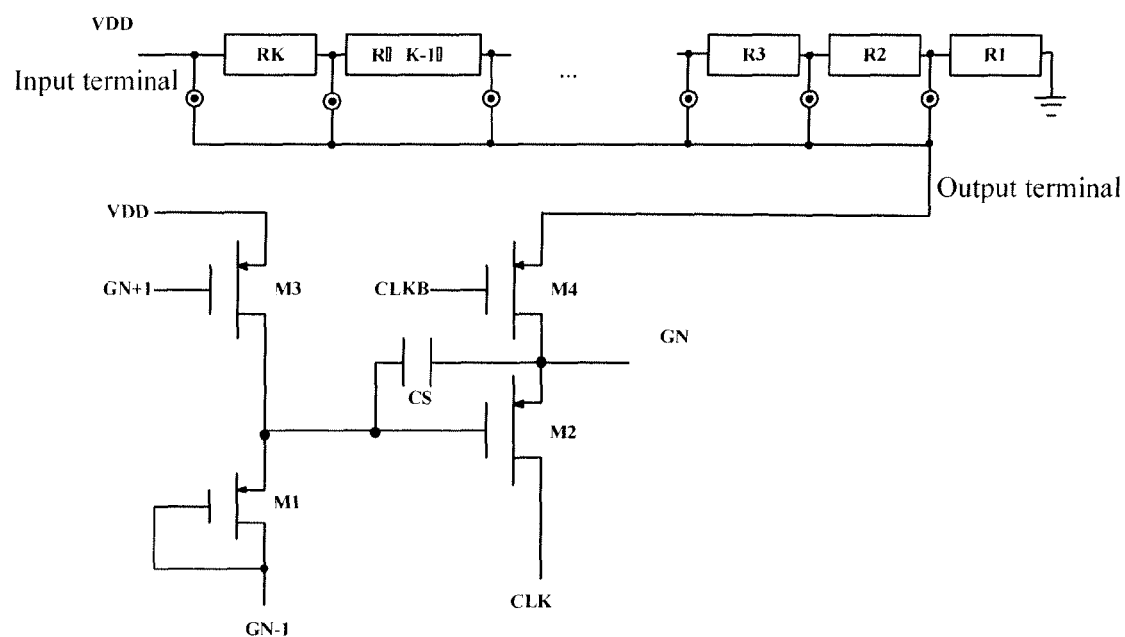
FIG. 6 is a circuit diagram of a shift register constituted by P-type TFTs in the second embodiment of the present disclosure.

The shift register constituted by P-type TFTs as shown in FIG. 6 is a shift register in the second embodiment of the present disclosure, the thin film transistor at the output terminal of the shift register is M4, the manner for compensating for the threshold voltage of M4 in FIG. 6 is similar to that in FIG. 5, and the difference therebetween lies in that the compensation in the shift register constituted by P-type TFTs is implemented by adjusting the value of VDD through the compensation circuit connected to M4 rather than by adjusting the value of VSS.

It should be explained that, in a display panel with a medium or small size, the difference among drifts of the threshold voltages of TFTs inside a same panel is controllable (that is, there is a consistence among all of the drifts), so the normal operation of the shift register can be ensured when the technical solution of the second embodiment of the present disclosure is applied.

Third Embodiment

In the third embodiment, there is provided a method for compensating for the threshold voltage of the thin film transistor by the compensation circuit provided in the first embodiment, the method includes:

switching on the connection between the input terminal and the output terminal when the current threshold voltage of the thin film transistor is consistent with the predetermined standard threshold voltage, and switching off the connection between the input terminal and the output terminal when the current threshold voltage of the thin film transistor is inconsistent with the predetermined standard threshold voltage; and switching off or switching on the connection between the output terminal and the $k^{th}$ resistor when the current threshold voltage of the thin film transistor is inconsistent with the predetermined standard threshold voltage, wherein k is a positive integer greater than or equal to 1 and less than or equal to K−1.

Fourth Embodiment

In the fourth embodiment, there is provided a display device including the shift register in the second embodiment.

The above descriptions are only for illustrating the embodiments of the present disclosure, and in no way limit the scope of the present disclosure. It will be obvious that those skilled in the art can make modifications, variations and equivalences to the above embodiments without departing from the spirit and scope of the present disclosure as defined by the following claims. Such variations and modifications are intended to be included within the spirit and scope of the present disclosure.

What is claimed is:

1. A threshold voltage compensation circuit of a thin film transistor, comprising a compensation module connected to a source of the thin film transistor;

wherein the compensation module comprises an input terminal, an output terminal connected to the source of the thin film transistor a first resistor to a $K^{th}$ resistor connected in series, a $K^{th}$ connectable link and at least one first connectable link, wherein K is a positive integer greater than 1;

wherein the $K^{th}$ connectable link corresponds to the $K^{th}$ resistor and is disposed between the input terminal and the output terminal;

the first connectable link is disposed between a node where a $k^{th}$ resistor and a $(k+1)^{th}$ resistor are connected in series and the output terminal, wherein k is a positive integer greater than or equal to 1 and less than or equal to K−1; and the first resistor to the $K^{th}$ resistor are configured to divide a supply voltage input to the input terminal under controls of the $K^{th}$ connectable link and at least one first connectable link so as to adjust a voltage applied to the source of the thin film transistor.

2. The threshold voltage compensation circuit of claim 1, wherein the compensation module is configured to control a voltage difference between the gate and source of the thin film transistor to be equal to a current threshold voltage of the thin film transistor when the current threshold voltage is inconsistent with a predetermined standard threshold voltage;

one terminal of the first resistor is connected to one terminal of he second resistor and the other terminal of the first resistor is grounded;

one terminal of the $K^{th}$ resistor is connected to the input terminal and the other terminal of the $K^{th}$ resistor is connected to one terminal of the $(K-1)^{th}$ resistor;

wherein the $K^{th}$ connectable link is configured to switch on a connection between the input terminal and the output terminal when the current threshold voltage of the thin film transistor is consistent with the predetermined standard threshold voltage, and to switch off the connection between the input terminal and the output terminal when the current threshold voltage of the thin film transistor is inconsistent with the predetermined standard threshold voltage;

the first connectable link is configured to switch off or switch on a connection between the output terminal and the $k^{th}$ resistor when the current threshold voltage of the thin film transistor is inconsistent with the predetermined standard threshold voltage.

3. The threshold voltage compensation circuit of claim 2, wherein the number of the first connectable links is K−1, that is, the first connectable links are a connectable link 1 to a connectable link (K−1) respectively, and correspond to a first resistor to a $(K-1)^{th}$ resistor respectively, wherein the connectable link k is arranged between the node where the $k^{th}$ resistor and the $(k+1)^{th}$ resistor are connected in series and the output terminal.

4. The threshold voltage compensation circuit of claim 3, wherein the first resistor to the $K^{th}$ resistor connected in series have a same resistance value.

5. The threshold voltage compensation circuit of claim 3, when the thin film transistor is an N-type thin film transistor, the supply voltage input to the input terminal is less than 0, and when the current threshold voltage of the thin film transistor is inconsistent with the predetermined standard threshold voltage, the connectable link 1 to the connectable link m−1 are switched off and the connectable link m is switched on, wherein m is determined by a following equation:

$$\Delta V = \frac{\sum_{j=m+l}^{K} R_j}{\sum_{i=1}^{K} R_i} \times V$$

wherein $\Delta V$ represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

6. The threshold voltage compensation circuit of claim 3, wherein the thin film transistor is a P-type thin film transistor, the supply voltage input to the input terminal is greater than 0, and when the current threshold voltage of the thin film transistor is inconsistent with the predetermined standard threshold voltage, the connectable link m+1 to the connectable link K−1 are switched off and the connectable link m is switched on, wherein m is determined by a following equation:

$$\Delta V = \frac{\sum_{j=m+l}^{K} R_j}{\sum_{i=1}^{K} R_i} \times V$$

wherein $\Delta V$ represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

7. The threshold voltage compensation circuit of claim 2, wherein the first resistor to the $K^{th}$ resistor connected in series have a same resistance value.

8. The threshold voltage compensation circuit of claim 7, when the thin film transistor is an N-type thin film transistor, the supply voltage input to the input terminal is less than 0, and when the current threshold voltage of the thin film transistor is inconsistent with the predetermined standard threshold voltage, the connectable link 1 to the connectable link m−1 are switched off and the connectable link m is switched on, wherein m is determined by a following equation:

$$\Delta V = \frac{\sum_{j=m+l}^{K} R_j}{\sum_{i=1}^{K} R_i} \times V$$

wherein $\Delta V$ represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

9. The threshold voltage compensation circuit of claim 7, wherein the thin film transistor is a P-type thin film transistor, the supply voltage input to the input terminal is greater than 0, and when the current threshold voltage of the thin film transistor is inconsistent with the predetermined standard threshold voltage, the connectable link m+1 to the connectable link K−1 are switched off and the connectable link m is switched on, wherein m is determined by a following equation:

$$\Delta V = \frac{\sum_{j=m+l}^{K} R_j}{\sum_{i=1}^{K} R_i} \times V$$

wherein $\Delta V$ represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

10. A shift register comprising the threshold voltage compensation circuit of claim 1, wherein a drain of the thin film transistor is connected to an output terminal of the shift register.

11. A display device comprising the shift register of claim 10.

12. The shift register of claim 10, wherein wherein the $K^{th}$ connectable link is configured to switch on a connection between the input terminal and the output terminal when the current threshold voltage of the thin film transistor is consistent with the predetermined standard threshold voltage, and to switch off the connection between the input terminal and the output terminal when the current threshold voltage of the thin film transistor is inconsistent with the predetermined standard threshold voltage;

the first connectable link configured to switch off or switch on a connection between the output terminal and the $k^{th}$ resistor when the current threshold voltage of the thin film transistor is inconsistent with the predetermined standard threshold voltage, wherein k is a positive integer greater than or equal to 1 and less than or equal to K−1;

one terminal of the first resistor is connected to one terminal of the second resistor and the other terminal of the first resistor is grounded;

one terminal of the $K^{th}$ resistor is connected to the input terminal and the other terminal of the $K^{th}$ resistor is connected to one terminal of the $(K-1)^{th}$ resistor.

13. The shift register of claim 12, wherein the number of the first connectable links is K−1, that is, the first connectable links are a connectable link 1 to a connectable link (K−1) respectively, and correspond to a first resistor to a $(K-1)^{th}$ resistor respectively, wherein the connectable link k is arranged between the node where the kth resistor and the $(k+1)^{th}$ resistor are connected in series and the output terminal.

14. The shift register of claim 13, wherein the first resistor to the $K^{th}$ resistor connected in series have a same resistance value.

15. The shift register of claim 13, when the thin film transistor is an N-type thin film transistor, the supply voltage input to the input terminal is less than 0, and when the current threshold voltage of the thin film transistor is inconsistent with the predetermined standard threshold voltage, the connectable link 1 to the connectable link m−1 are switched off and the connectable link m is switched on, wherein m is determined by a following equation:

$$\Delta V = \frac{\sum_{j=m+l}^{K} R_j}{\sum_{i=1}^{K} R_i} \times V$$

wherein $\Delta V$ represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

16. The shift register of claim 13, wherein the thin film transistor is a P-type thin film transistor, the supply voltage input to the input terminal is greater than 0, and when the current threshold voltage of the thin film transistor is inconsistent with the predetermined standard threshold voltage, the connectable link m+1 to the connectable link K−1 are switched off and the connectable link m is switched on, wherein m is determined by a following equation:

$$\Delta V = \frac{\sum_{j=m+l}^{K} R_j}{\sum_{i=1}^{K} R_i} \times V$$

wherein $\Delta V$ represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

17. The shift register of claim 12, wherein the first resistor to the $K^{th}$ resistor connected in series have a same resistance value.

18. The shift register of claim 17, when the thin film transistor is an N-type thin film transistor, the supply voltage input to the input terminal is less than 0, and when the current threshold voltage of the thin film transistor is inconsistent with the predetermined standard threshold voltage, the connectable link 1 to the connectable link m−1 are switched off and the connectable link m is switched on, wherein m is determined by a following equation:

$$\Delta V = \frac{\sum_{j=m+l}^{K} R_j}{\sum_{i=1}^{K} R_i} \times V$$

wherein $\Delta V$ represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

19. The shift register of claim 17, wherein the thin film transistor is a P-type thin film transistor, the supply voltage input to the input terminal is greater than 0, and when the current threshold voltage of the thin film transistor is inconsistent with the predetermined standard threshold voltage, the connectable link m+1 to the connectable link K−1 are switched off and the connectable link m is switched on, wherein m is determined by a following equation:

$$\Delta V = \frac{\sum_{j=m+1}^{K} R_j}{\sum_{i=1}^{K} R_i} \times V$$

wherein ΔV represents a difference between the current threshold voltage and the predetermined threshold voltage, V represents a voltage input to the input terminal, $R_i$ represents a resistance value of the $i^{th}$ resistor, i represents a positive integer greater than or equal to 1 and less than or equal to K, and m represents a positive integer greater than or equal to 1 and less than or equal to K−1.

20. A method for compensating for a threshold voltage of a thin film transistor, wherein the thin film transistor has a source connected to a compensation module; wherein the compensation module comprises an input terminal, an output terminal connected to the source of the thin film transistor, a first resistor to a $K^{th}$ resistor connected in series, a $K^{th}$ connectable link and at least one first connectable link, wherein K is a positive integer greater than 1; the $K^{th}$ connectable link corresponds to the $K^{th}$ resistor and is disposed between the input terminal and the output terminal; the first connectable link is disposed between a node where a $k^{th}$ resistor and a $(k+1)^{th}$ resistor are connected in series and the output terminal, wherein k is a positive integer greater than or equal to 1 and less than or equal to K−1; and the first resistor to the $K^{th}$ resistor are configured to divide a supply voltage input to the input terminal under controls of the $K^{th}$ connectable link and at least one first connectable link so as to adjust a voltage applied to the source of the thin film transistor, the method comprising:

controlling a voltage difference between a gate and source of the thin film transistor to be equal to a current threshold voltage of the thin film transistor when the current threshold voltage of the thin film transistor is inconsistent with the predetermined standard threshold voltage.

* * * * *